United States Patent
Yamazaki

(10) Patent No.: US 7,052,986 B2
(45) Date of Patent: May 30, 2006

(54) METHOD OF MANUFACTURING A SEMICONDUCTOR DEVICE

(75) Inventor: Yasuo Yamazaki, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 10/664,858

(22) Filed: Sep. 22, 2003

(65) Prior Publication Data

US 2004/0058516 A1    Mar. 25, 2004

(30) Foreign Application Priority Data

Sep. 20, 2002    (JP) .............................. 2002-275948

(51) Int. Cl.
*H01L 21/4763* (2006.01)
(52) U.S. Cl. .................. 438/622; 438/618; 430/22; 430/30; 430/311; 355/26; 355/53
(58) Field of Classification Search ........ 438/622–618, 438/201; 430/22, 30, 311; 355/26, 53
See application file for complete search history.

(56) References Cited

U.S. PATENT DOCUMENTS

| | | | |
|---|---|---|---|
| 5,561,317 A | 10/1996 | Momma et al. | 257/620 |
| 5,731,131 A | 3/1998 | Momma et al. | 430/311 |
| 6,204,912 B1 | 3/2001 | Tsuchiya et al. | 355/53 |
| 6,238,851 B1 | 5/2001 | Nishi | 430/394 |
| 6,828,085 B1 * | 12/2004 | Kochi et al. | 430/394 |

FOREIGN PATENT DOCUMENTS

| | | |
|---|---|---|
| EP | 0 557 079 A2 | 8/1993 |
| EP | 0 959 501 A2 | 11/1999 |
| JP | 4-326507 | 11/1992 |

OTHER PUBLICATIONS

European Search Report dated May 10, 2005, issued in corresponding European patent application No. EP 03 02 1242, forwarded in a Communication dated May 19, 2005.

* cited by examiner

*Primary Examiner*—Dung A. Le
(74) *Attorney, Agent, or Firm*—Fitzpatrick, Cella, Harper & Scinto

(57) ABSTRACT

A method for manufacturing a semiconductor apparatus device includes a plurality of layers on a semiconductor substrate. The method includes the steps of dividing a pattern of at least a layer into a plurality of sub-patterns, and joining the divided sub-patterns to perform patterning. The layer including wiring substantially affects operation of the semiconductor device depending on a positional relationship to any other wiring, the patterning is performed by one-shot exposure using a single mask, and only as to the layer including the wiring substantially affecting the operation of the semiconductor device depending on the positional relationship to any other wiring, the patterning is performed by one-shot exposure, and as to all of the other layers, the patterning is performed by division exposure.

4 Claims, 7 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, more particularly, to a method of manufacturing a semiconductor device composed of a plurality of layers.

2. Related Background Art

Conventionally, in a method of manufacturing a semiconductor device having a large chip size and a fine pattern, the pattern of each layer (hereinafter referred to as an "original pattern") is divided into a plurality of patterns (hereinafter referred to as "divided patterns"), and an original pattern on a layer is formed by joining the divided patterns to be exposed (hereinafter referred to as "split exposure"). These processes are repeated several times to manufacture a semiconductor device composed of a plurality of layers (see, for example, U.S. Pat. No. 5,561,317, and U.S. Pat. No. 5,731,131).

FIG. 6 is a plan view showing the structure of a part of a semiconductor device manufactured by the conventional manufacturing method. With reference to FIG. 6, the semiconductor device 90 includes an active region 91, polysilicon layers 92, contact holes 93 and metal layers 94 and 95. Here, the structure of a pixel of a semiconductor device to be used in an image pickup apparatus such as a digital camera, or the like, is exemplified.

The active region 91 becomes a photoelectric conversion portion.

The polysilicon layers 92 become gate electrodes of a metal oxide semiconductor field effect transistor (MOS FET). The contact holes 93 become electrodes connecting layers. The metal layers 94 and 95 become wiring.

In the actual semiconductor device 90, a plurality of pattern, one of which is shown in FIG. 6, is continuously formed in the upper and lower directions and the right and left directions.

A section (a) and a section (b) of FIG. 7 are views for illustrating the method of manufacturing the semiconductor device shown in FIG. 6. The section (a) of FIG. 7 shows a plan view of the semiconductor device. The section (b) of FIG. 7 shows a sectional view taken on an A–A' line in the plan view.

With reference to the section (a) of FIG. 7, the patterns repeating a pattern in the upper and the lower directions and the right and the left directions are formed on the semiconductor device 90. The repeating patterns of each layer are set as an original pattern and are divided into a plurality of divided patterns. Then, the divided patterns are joined with each other to form the pattern of each layer. An X–X' line in the sections (a) and (b) of FIG. 7 indicates a joint between the divided patterns.

In the method of manufacturing the semiconductor device 90 shown in FIG. 6, and the sections (a) and (b) of FIG. 7, a thermal oxidation film and a SiN film are first formed on a silicon substrate (not shown), and the films are processed by dry etching with a mask having a predetermined pattern to leave the patterns of the active regions 91. After the formation of the active regions 91, next, a local oxidation of silicon (LOCOS) film (not shown) is formed by thermal oxidation processing.

Next, an ion implantation is performed with a mask having a predetermined pattern to form a predetermined diffusion layer.

Next, a film of polysilicon is formed, and the dry etching with a mask having a predetermined pattern of the polysilicon film is performed to form the polysilicon layers 92 being the gate electrodes of the MOS FET's. After the formation of the polysilicon layers 92, an interlayer insulation film (not shown) is formed.

Next, the contact holes 93 are formed in the interlayer insulation film with a mask having a predetermined pattern.

Next, an Al—Cu film is formed, and the dry etching of the Al—Cu film is performed with a mask having a predetermined pattern to form first layer metal layers 94. After the formation of the metal layers 94, an interlayer insulation film (not shown) is formed, and through holes are formed in the interlayer insulation film.

Next, an Al—Cu film is formed, and the dry etching of the Al—Cu film is performed with a mask having a predetermined pattern to form second layer metal layers 95.

The patterns of these respective layers, including the polysilicon layers 92, are formed by division exposure using the X–X' line as a joint. The split exposure is performed by repeating the formation of a divided pattern and a movement of the silicon substrate by the step and repeat method. In the division exposure, alignment to a ground (hereinafter referred to as "alignment") using an alignment mark formed on the ground as a landmark is performed before forming each divided pattern. In the division exposure, focusing may be performed to each divided pattern (see, for example, the abstract of Japanese Patent Application Laid-Open No. H04-326507). Moreover, the example of the division exposure in which all of the patterns of respective layers are exposed by the use of the same X–X' line as the joint is shown here, but the joint of each layer may be shifted (see, for example, U.S. Pat. No. 6,204,912).

By the manufacturing method described above, a semiconductor device having a large chip size and fine patterns can be easily manufactured.

In the split exposure, each divided pattern is aligned by the alignment. However, the alignment includes errors (hereinafter referred to as "alignment errors") to some degree. Consequently, there is a case wherein discrepancies are produced among the divided patterns of respective layers at the X–X' line in the section (a) of FIG. 7.

The shape of the polysilicon layer at the cross section at the A–A' line is shown in the section (b) of FIG. 7.

When there is a discrepancy between divided patterns, an interval "a'" between gate electrodes 81 and 82, which are made of polysilicon in two divided patterns adjoining the X–X' line, is not equal to a distance "a". Incidentally, the example of a'<a is shown in the section (b) of FIG. 7, but it is naturally possible for this to be a'>a. On the other hand, there is no joint of divided patterns between gate electrodes 83 and 84. Consequently, no discrepancy is produced between the gate electrodes 83 and 84.

Moreover, parasitic capacitance is generated between close electrodes or wiring, and the value of the capacitance differs according to the distance between them even if the shapes of them are the same. Consequently, the capacitance formed over a joint has a different value from the value of the capacitance formed between things without any joint between them. In an image pickup apparatus, or the like, the capacitance difference appears as an output difference between pixels to generate a stripe on a screen, in some cases. In particular, when a discrepancy owing to a joint is produced between adjoining electrodes (wiring) in the layers (hereupon, the polysilicon layers) to be used as the control electrodes (wiring) of MOS FET's, which amplify and transfer signals and thereby, the parasitic capacitance differs, the difference frequently causes a big problem.

SUMMARY OF THE INVENTION

An objective of the present invention is to provide a method of manufacturing a semiconductor device in which the influence of the alignment errors is decreased. The present invention solves at least one of the above-mentioned problems.

For solving the above-mentioned problems, a manufacturing method of the present invention is a method of manufacturing a semiconductor apparatus composed of a plurality of layers, the method comprising the steps of: dividing a pattern of at least one layer into a plurality of sub-patterns, and joining the divided sub-pattern to perform patterning by division exposure, wherein as to a layer including wiring substantially affecting operation of the semiconductor device depending on some positional relationship to any other wiring, the patterning is performed by one-shot exposure using a single mask.

Consequently, at least the wiring sensitive to the positional relationship to the other wiring is formed in a fixed positional relationship by the one-shot exposure.

Moreover, as to a layer including wiring in which a value of parasitic capacitance generated by a positional relationship to other wiring substantially affects the operation of the semiconductor device, patterning may be performed by one-shot exposure using a single mask.

Consequently, at least the wiring sensitive to the value of the parasitic capacitance generated by the positional relationship to the other wiring is formed in a fixed positional relationship by the one-shot exposure.

Moreover, the semiconductor device may include a plurality of elements each having a same structure composed of a plurality of layers including a plurality of same patterns, respectively, and, as to a layer including wiring which causes dispersion of a characteristic of each of the elements, the dispersion substantially affecting the operation of the semiconductor device, when a difference exists in the value of the parasitic capacitance among the elements, the one-shot exposure using a single mask may be performed.

Consequently, the wiring sensitive to the value of the parasitic capacity in each element is formed in a fixed positional relationship by the one-shot exposure, and thereby, the characteristic of each element is made uniform.

Moreover, the semiconductor device may be an image pickup apparatus for performing photoelectric conversion, and, as to a layer including wiring which causes an output difference of the photoelectric conversion at a degree of being visible in an image when there is a difference in the value of the parasitic capacitance among the pixels, the one-shot exposure using a mask may be performed.

Consequently, the wiring sensitive to the value of the parasitic capacity in each element is formed in a fixed positional relationship by the one-shot exposure, and thereby, the photoelectric conversion characteristic of each element is made uniform. Consequently, the image pickup apparatus is not substantially influence up to the degree to be visible on an image.

According to one aspect of the present invention, the semiconductor apparatus is a complementary metal oxide semiconductor (CMOS) area sensor, and each element is a CMOS sensor in the CMOS area sensor, and further, a layer including the wiring being the gate electrode of a field effect transistor in the CMOS sensor, the wiring generating parasitic capacitance, is formed by the one-shot exposure using a single mask.

According to another aspect of the present invention, the wiring substantially affecting the operation of the semiconductor apparatus depending on some positional relationship to the other wiring is wiring directly connected to the semiconductor layer. Moreover, according to a more concrete aspect, the wiring is made of polysilicon.

Moreover, only on the layer including the wiring substantially affecting the operation of the semiconductor device depending on some positional relationship to the other wiring, the pattern may be formed by one-shot exposure, and on all of the other layers, patterns may be formed by division exposure.

As described above, because only the wiring sensitive to the positional relationship to the other wiring is formed in a fixed positional relationship by the one-shot exposure, the semiconductor apparatus is not substantially influenced on its operation, and fine patterns may be included in the other layers.

Moreover, on layers on which patterns are formed before forming the pattern on the layer including the wiring substantially affecting the operation of the semiconductor device depending on some positional relationship to any other wiring, the patterns may be formed by one-shot exposure, and on all of the other layers on which patterns are formed after the one-shot exposure, patterns may be formed by division exposure.

Consequently, because the patterns are formed by the one-shot exposure on the layers up to the layer including the wiring sensitive to the positional relationship to the other wiring, the alignment of the one-shot exposure may be performed by locating the layer to be aligned to the pattern formed by the one-shot exposure on the ground, and consequently, the alignment is easy. Moreover, the positional relationship between the wiring sensitive to the positional relationship to the other wiring and the pattern on the ground can be made uniform.

Other features and advantages of the present invention will be apparent from the following description taken in conjunction with the accompanying drawings, in which like reference characters designate the same or similar parts throughout the figures thereof.

Figure 5:
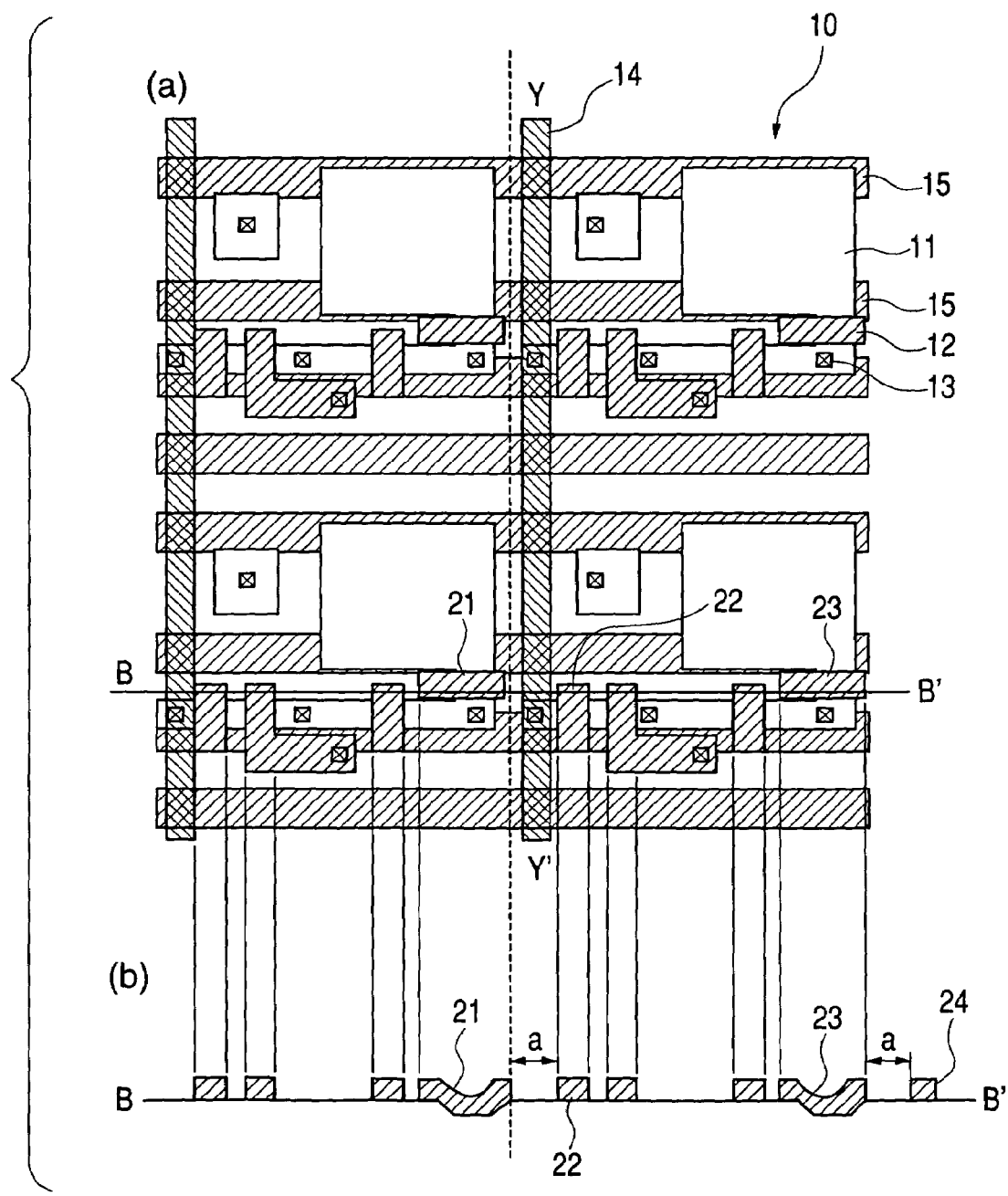
Figure 6:
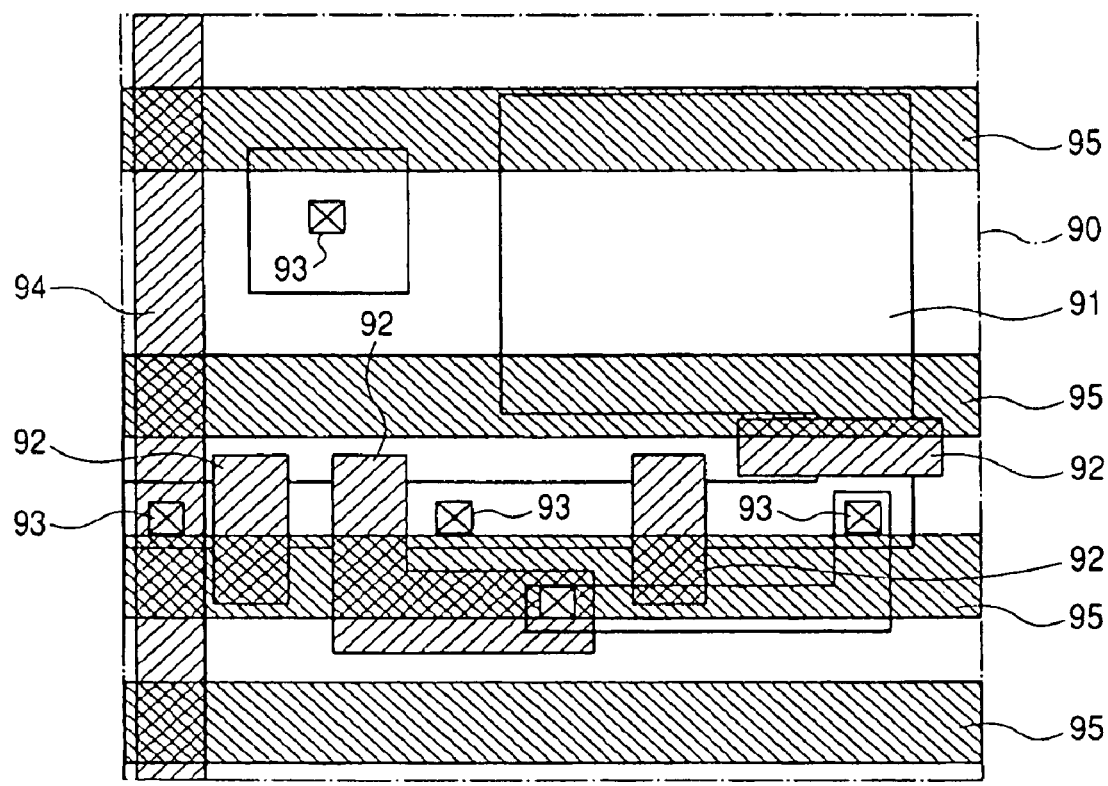
Figure 7:
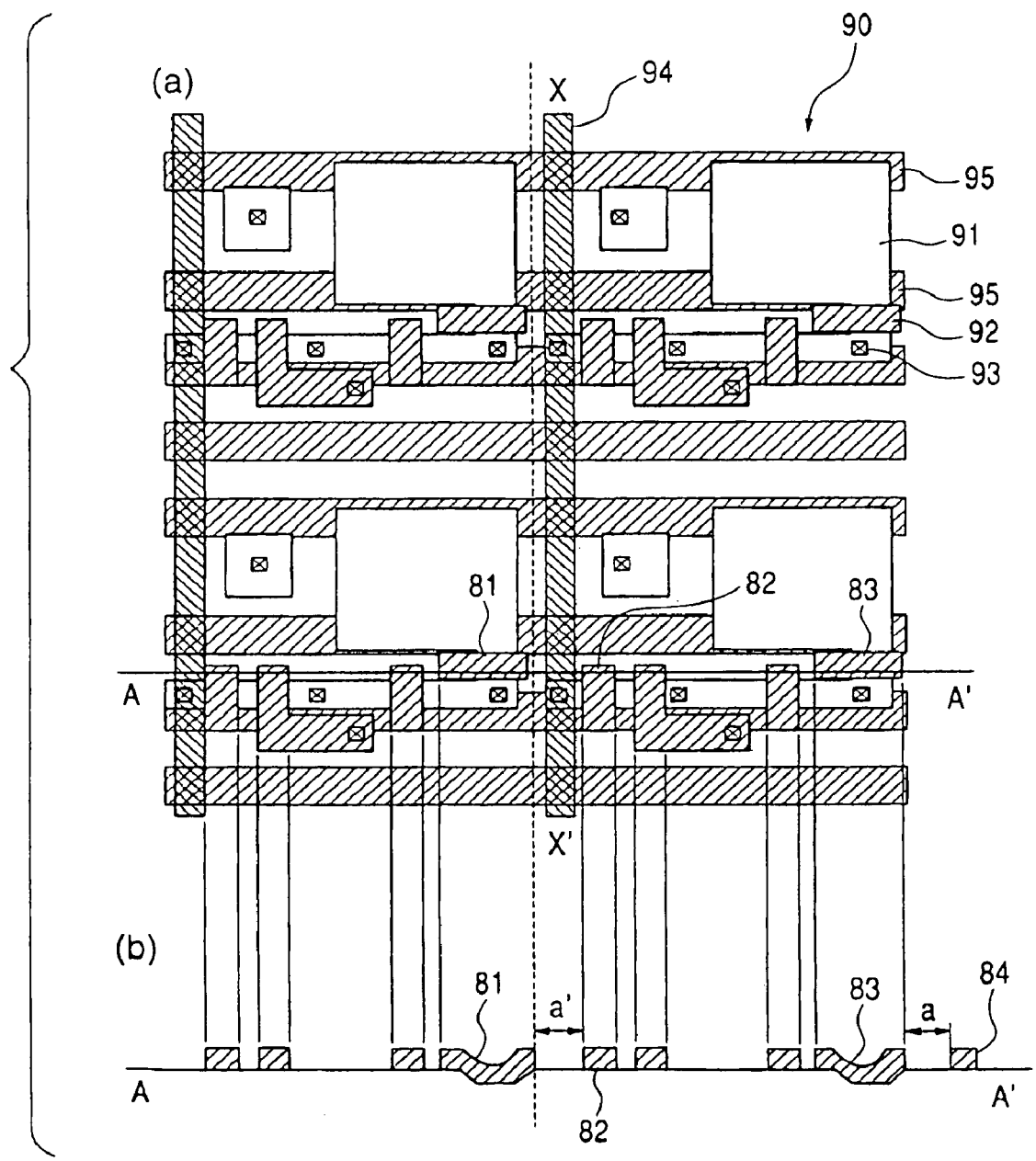

Sections (a) and (b) of FIG. 5 are a plane view and a sectional view, respectively, showing the structure of the portions of split patterns of the semiconductor device of the present embodiment, which portions adjoin at a joint;

FIG. 6 is a plan view showing the structure of a part of a semiconductor device manufactured by a conventional manufacturing method; and Sections (a) and (b) of FIG. 7 are views illustrating the method of manufacturing the semiconductor device shown in FIG. 6.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The attached drawings are referred to while an embodiment of the present invention is described in detail.

The semiconductor device of the present embodiment is one to be used for an image pickup apparatus such as a digital camera, and the like. The semiconductor device has a large chip size and fine patterns.

Figure 1:
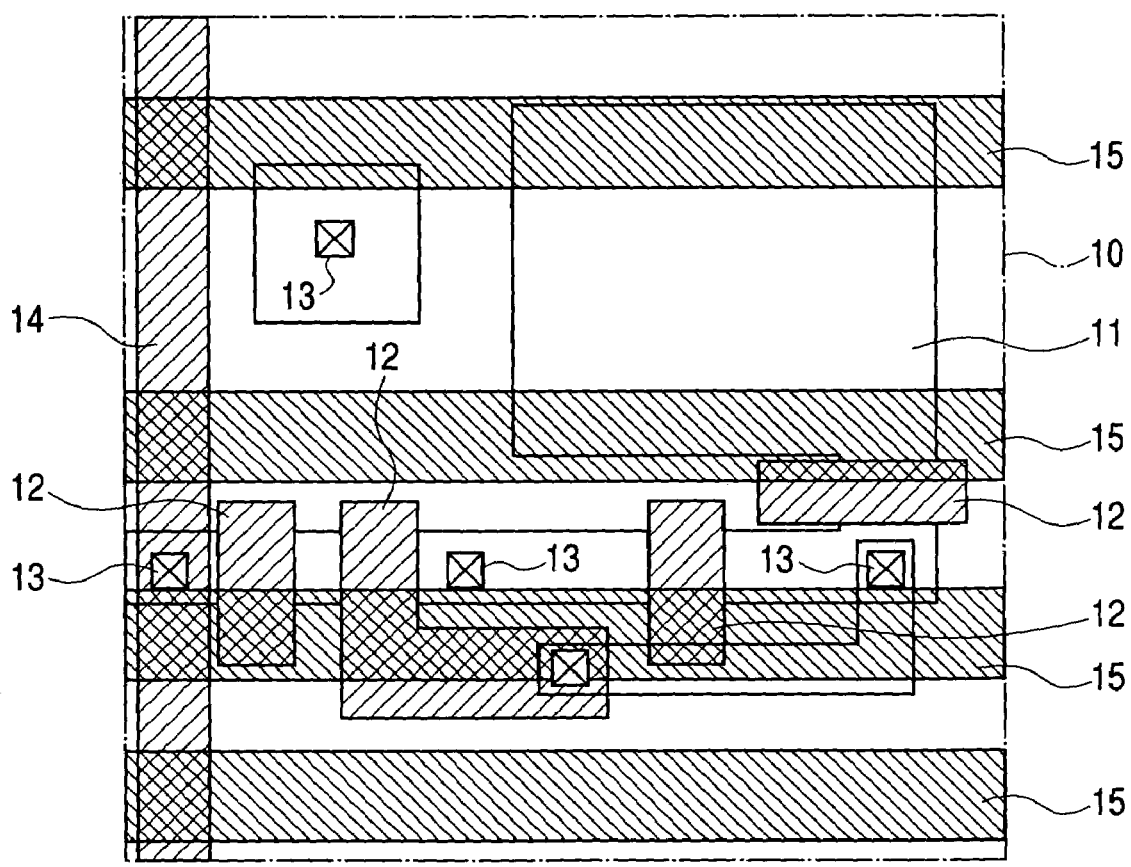
FIG. 1 is a plan view showing a circuit of a pixel of a semiconductor device according to a present embodiment.

FIG. 1 is a plan view showing a circuit of a pixel of the semiconductor device according to the present embodiment. With reference to FIG. 1, the semiconductor device 10 includes an active region 11, polysilicon layers 12, contact holes 13 and methal layers 14 and 15.

The active region 11 becomes a photoelectric conversion portion. A sensor which includes a pixel portion as well as peripheral circuits and is formed by a complementary metal oxide semiconductor (CMOS) process is generally called a CMOS sensor. The pixels of the sensor photodiodes (not shown) are included. A solid stage image pickup apparatus including a plurality of pixels in a matrix is called a CMOS area sensor.

The gate electrode of each MOS FET constituting a CMOS sensor is formed by the polysilicon layer 12. A MOS FET includes a selection transistor for selecting an arbitrary pixel among a plurality of pixels, and a transfer transistor for transferring the photoelectrically converted output of the selected pixel.

The contact holes 13 become electrode connecting layers. Wiring is formed by the metal layers 14 and 15.

In an actual semiconductor device, the pattern shown in FIG. 1 is continuously formed in a matrix. The semiconductor apparatus 10 works as a CMOS area sensor in which pixels are arranged in a matrix including a predetermined number of rows and a predetermined number of columns. Then, the CMOS area sensor selects each pixel and takes in the photoelectrically converted output of each pixel to obtain image data.

FIGS. 2A and 2B to FIG. 4 are views for illustrating each process of a manufacturing method of the semiconductor device shown in FIG. 1.

Figure 2A:
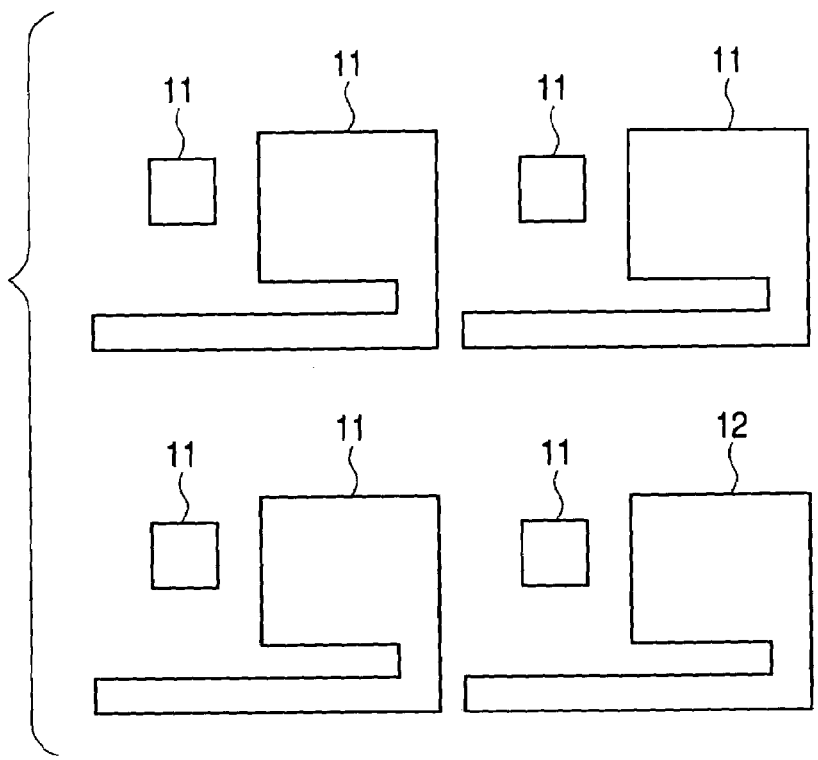
FIGS. 2A and 2B are views illustrating each process in the method of manufacturing the semiconductor device shown in FIG. 1.

With reference to FIG. 2A, a thermal oxidation film and a SiN film are first formed on a silicon substrate (not shown), and the films are processed by dry etching with a mask having a predetermined pattern to leave the pattern of the active regions 11. Because the active regions 11 do not include a fine pattern, it is possible to expose the whole layer with a mask (hereinafter referred to as "one-shot exposure"). Accordingly, in the process of forming the patterns of the active regions 11, a pattern of the whole layer is formed by the one-shot exposure. After the formation of the active regions 11, next, a LOCOS film (not shown) is formed by thermal oxidations processing.

Figure 2B:
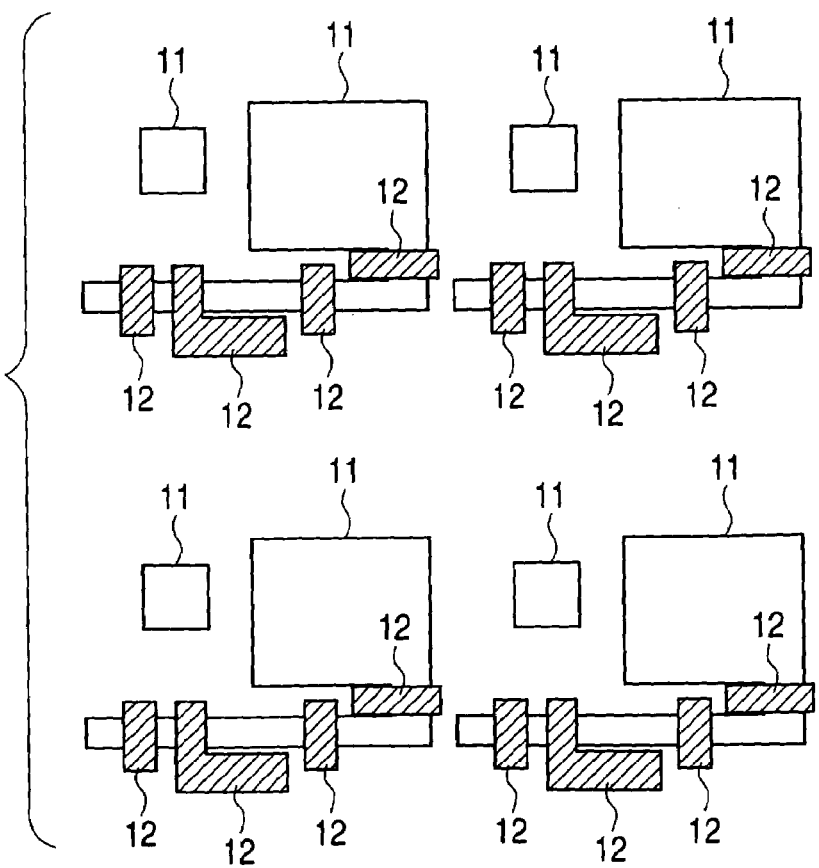

Next, with reference to FIG. 2B, a film of polysilicon is formed, and the dry etching with a mask having a predetermined pattern of the polysilicon film is performed to form the polysilicon layers 12 being the gate electrodes of the MOS FET. The polysilicon layers 12 do not include any fine pattern, and are easily influenced by parasitic capacitance. The parasitic capacitance is generated, for example, between wiring of two gate electrodes made of the polysilicon layers 12, and the value of the parasitic capacitance differs according to the positional relationship between the wiring. When the value of the parasitic capacitance changes, a substantial effect is given on the operation of the semiconductor device 10. For example, an output difference of photoelectric conversion in a degree visible on an image is generated. Accordingly, also in the process of forming the patterns of the polysilicon layers 12, a pattern of all of the layers 12 is formed by one-shot exposure. After the formation of the polysilicon layers 12, an interlayer insulation film (not shown) is formed.

Figure 3A:
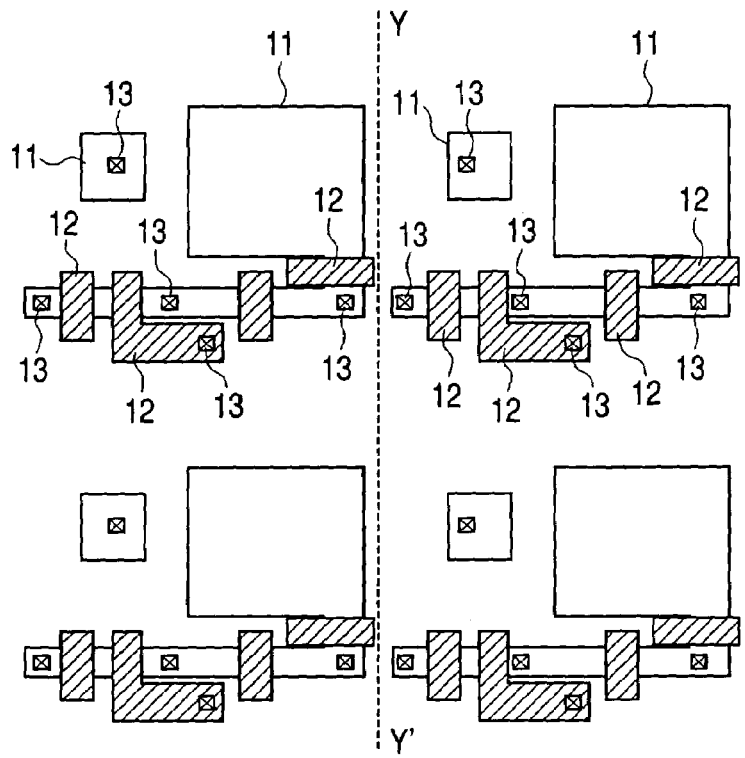
FIGS. 3A and 3B are views illustrating each process in the method of manufacturing the semiconductor device shown in FIG. 1.

Next, with reference to FIG. 3A, the contact holes 13 are formed in the interlayer insulation film with a mask having a predetermined pattern. The contract holes 13 require fine designing. Accordingly, the pattern of the whole layer (hereinafter referred to as "original pattern") is split into a plurality of patterns (hereinafter referred to as "split patterns"), and the original pattern is formed by joining the split patterns to be exposed (hereinafter referred to as "split exposure") by the step and repeat method.

In the split exposure, alignment to the ground (hereinafter referred to as "alignment") using an alignment mark formed on the ground as a landmark is performed before forming each split pattern. However, in the alignment, errors in some degree (hereinafter referred to as "alignment errors") are included.

In FIG. 3A, a joint of the patterns of the contact holes 13 exists on a line Y–Y'. This figure shows discrepancies of the positions of the contact holes 13 on both the sides of the Y–Y' line with emphasis. The discrepancies are produced by the alignment errors. However, such a degree of the discrepancies of the contact holes 13 (about 0.1 µm or less of the alignment errors) does not appear as any output difference between pixels.

Figure 3B:
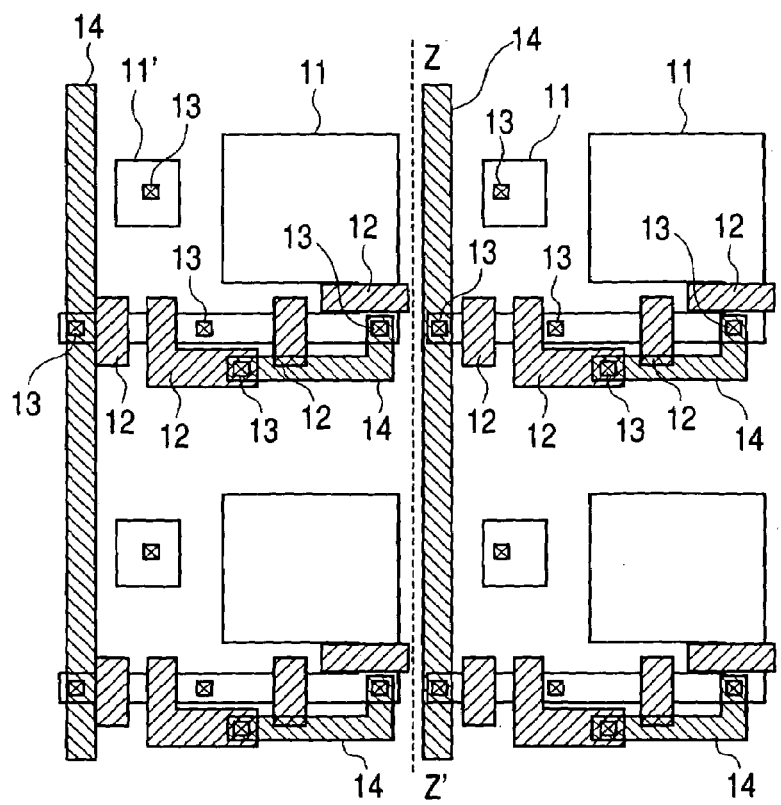

Next, with reference to FIG. 3B, an Al—Cu film is formed, and the dry etching of the Al—Cu film is performed with a mask having a predetermined pattern to form the metal layers 14. When the fine designing of the metal layers 14 is needed, the original pattern is divided into a plurality of divided sub-patterns, and split exposure is performed by the step and repeat method. In FIG. 3B, a joint of the patterns of the metal layers 14 exists on a line Z–Z'. This figure shows slight discrepancies of the positions of the wiring of the metal layers 14 on both sides of the Z–Z' line with emphasis. However, such a degree of the discrepancies of the wiring of the metal layers 14 does not appear as any output difference between pixels. Incidentally, as shown in FIG. 3B, the Z–Z' line is located at the same position as that of the Y–Y' line shown in FIG. 3A, but both lines may be located at different positions.

After the formation of the metal layer 14, an interlayer insulation film (not shown) is next formed, and through holes (not shown) are formed in the interlayer insulation film.

Figure 4:
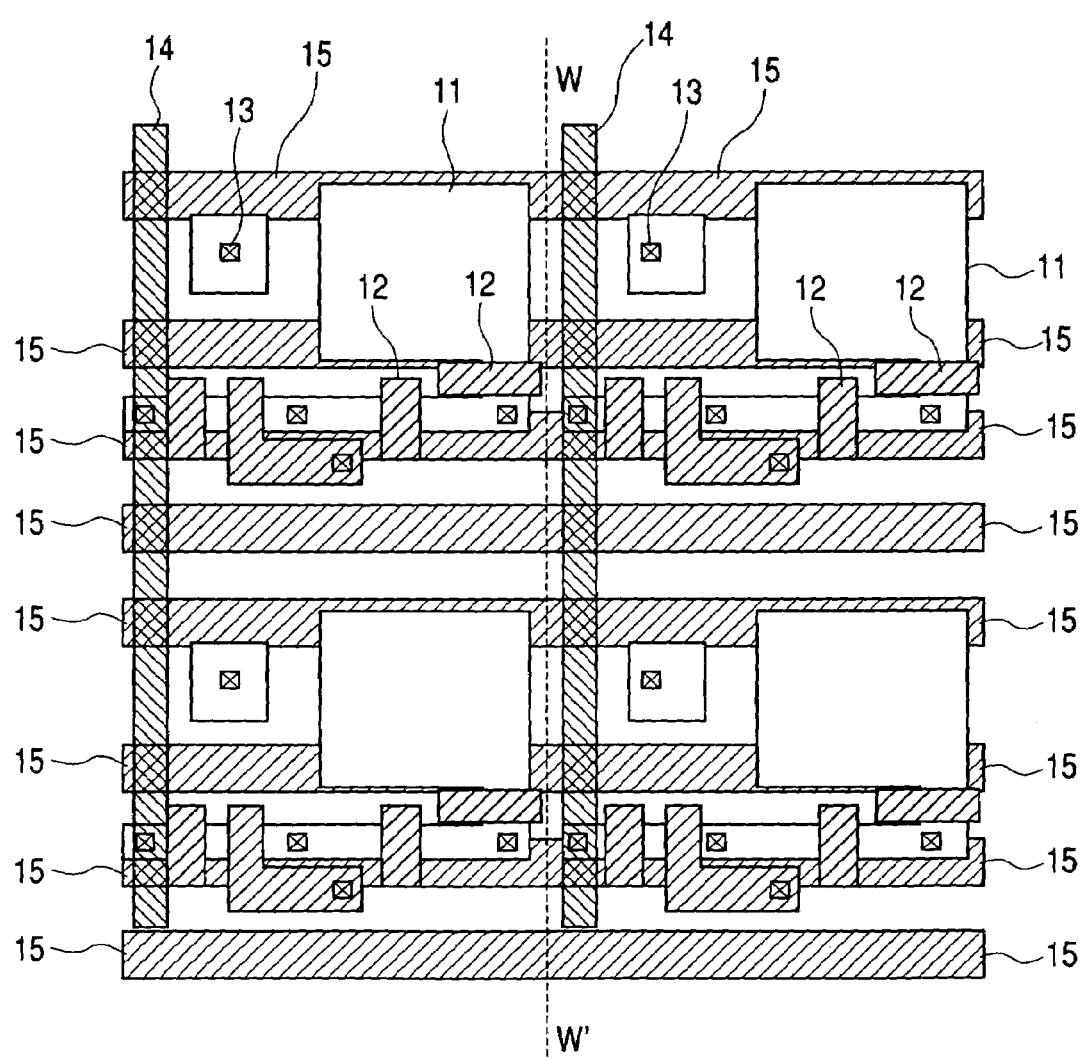
FIG. 4 is a view illustrating each process in the method of manufacturing the semiconductor device shown in FIG. 1.

Next, with reference to FIG. 4, an Al—Cu film is formed, and the dry etching of the Al—Cu film is performed with a mask having a predetermined pattern to form the metal layers 14. When the fine designing of the metal layers 15 is needed, the division exposure is performed. In FIG. 4, a joint of the patterns of the metal layers 15 exists on a line W–W', this figure shows slight discrepancies of the positions of the wiring of the metal layers 15 on both sides of the W–W' line with emphasis. However, such a degree of the discrepancies of the wiring of the metal layers 15 does not appear as any output difference between pixels. Incidentally, as shown in FIG. 4, the W–W' line is located at the same position as that of the Y–Y' line shown in FIG. 3A, but both lines may be located at different positions.

The sections (a) and (b) of FIG. 5 are a plan view and a sectional view, respectively, showing the structure of the portions of divided patterns of the semiconductor device of the present embodiment, which portions adjoin at a joint. The section (a) of FIG. 5 shows the plan view of the semiconductor device of the present embodiment, and the section (b) of FIG. 5 shows the sectional view at a line B–B' in the plan view.

With reference to the plan view of the section (a) of FIG. 5, the positions of the gate electrodes made of the polysilicon layers 12 do not shift from each other on both sides of the line Y–Y'.

In the section (b) of FIG. 5, the shapes of the polysilicon layers 12 at the cross section at the line B–B' are shown.

The interval between gate electrodes 21 and 22 adjoining each other with the Y–Y' line put between them is equal to a desired distance "b". Moreover, the interval between gate electrodes 23 and 24 without the Y–Y' line put between them is also equal to the distance "a".

As described above, because the polysilicon layers 12, which are easily influenced by parasitic capacitance, is formed by the one-shot exposure, and the contact holes 13 and the metal layers 14 and 15, which are not easily influenced by parasitic capacitance and need fine designing, are formed by the division exposure, the semiconductor device 10, which does not generate the dispersion of the parasitic capacitance of the gate electrodes made of the polysilicon layers 12 among pixels and can photograph images having no output difference between pixels, can be manufactured.

Incidentally, in the present embodiment, the polysilicon layers 12, which are easily influenced by parasitic capacitance, and the active regions 11, the pattern of which is formed before the polysilicon layers 12, are formed by the one-shot exposure, and the other layers (the contact holes 13 and the metal layers 14 and 15) are formed by the division exposure. Consequently, no dispersion of the parasitic capacitance of each of the gate electrodes of the polysilicon layers 12 is generated. Furthermore, the positional relationships between the polysilicon layers 12 and the active regions 11 located on the ground of the polysilicon layers 12 become uniform. Consequently, the alignment of the polysilicon layers 12 is easy, and the output of each pixel becomes uniform. However, the present invention is not limited to the present embodiment. For example, it may be adopted to form only the pattern of the polysilicon layers 12 by the one-shot exposure, and to form the patterns of all of the other layers by the split exposure.

Incidentally, in the present embodiment, the CMOS area sensor of a solid state image pickup apparatus is exemplified. However, the present invention is not limited to the present embodiment. The present invention can be widely applied to the manufacturing of semiconductor apparatus composed of a plurality of layers.

Moreover, in the present embodiment, the one-shot exposure is performed up to the polysilicon layers 12. However, the present invention is not limited to the present embodiment. It is preferable to perform the one-shot exposure for the layers of the patterns in which the difference of the values of parasitic capacitance caused by alignment errors in division exposure may influence images as an output difference between pixels in the CMOS are sensor. The alignment errors which may be generated owing to the division exposure are determined according to the performance of a manufacturing apparatus. Moreover, the difference of the values of the parasitic capacitance between pixels, which difference is generated by the errors, is determined according to the quality of the material and the arrangement of a pattern. Moreover, the output difference between pixels caused by the difference of the parasitic capacitance is influenced by the generation place of the parasitic capacitance.

According to the present invention, because at least wiring sensitive to positional relationships to the other wiring is formed at a fixed positional relationship by one-shot exposure, a semiconductor device which is not influenced by substantial alignment errors on operation to operate in a good condition can be manufactured.

Moreover, because at least wiring sensitive to the value of parasitic capacitance to be caused by positional relationships to the other wiring is formed at a fixed positional relationship which is not substantially influenced on operation to operate in a good condition can be manufactured. In particular, in a CMOS area sensor, the layer in which the gate electrodes (wiring) of MOS FET's are formed (the polysilicon layer in the present invention) corresponds to the layer in which the substantial influences are not exerted on operation.

Moreover, because wiring sensitive to the value of parasitic capacitance in each element is formed at a fixed positional relationship by the one-shot exposure, the characteristic of each element is made uniform. Consequently, a semiconductor device which is not a substantial influence on operation to operate in a good condition can be manufactured.

Moreover, because wiring sensitive to the value of parasitic capacitance in each element is formed at a fixed positional relationship by one-shot exposure, the photoelectric conversion characteristic of each element is made uniform. Consequently, an image pickup apparatus which does not substantially influence (to be visible on an image in photography) a good image can be manufactured.

Moreover, because only the wiring sensitive to a positional relationship to the other wiring is formed in a fixed positional relationship by the one-shot exposure, a semiconductor apparatus is not a substantial influence on operation. Moreover, the other layers may include fine patterns.

Moreover, because patterns are formed by one-shot exposure on the layers up to the layer including wiring sensitive to a positional relationship to the other wiring, the alignment to the patterns formed by the one-shot exposure is sufficient as the alignment of the one-shot exposure, and then, the alignment is easy. Moreover, the positional relationship of the wiring sensitive to a positional relationship to the other wiring to the pattern of the ground can be made uniform.

Incidentally, the present invention achieves at least one of these advantages. Moreover, the present invention may be configured by suitably combining the above mentioned embodiments.

What is claimed is:

1. A method for manufacturing a semiconductor apparatus device including a plurality of layers on a semiconductor substrate, said method comprising the steps of:

dividing a pattern of at least a layer into a plurality of sub-patterns; and joining the divided sub-patterns to perform patterning, wherein as to a layer including wiring substantially affecting operation of the semiconductor device depending on a positional relationship to any other wiring, the patterning is performed by one-shot exposure using a single mask, wherein only as to the layer including the wiring substantially affecting the operation of the semiconductor device depending on the positional relationship to any other wiring, the patterning is performed by one-shot exposure, and as to all of the other layers, the patterning is performed by division exposure.

2. A method for manufacturing a semiconductor apparatus device including a plurality of layers on a semiconductor substrate, said method comprising the steps of:
   dividing a pattern of at least a layer into a plurality of sub-patterns; and
   joining the divided sub-patterns to perform patterning,
   wherein as to a layer including wiring substantially affecting operation of the semiconductor device depending on a positional relationship to any other wiring, the patterning is performed by one-shot exposure using a single mask,
   wherein as to layers to be patterned prior to the patterning of the layer including the wiring substantially affecting the operation of the semiconductor device depending on positional relationship to any other wiring, the patterning is performed by one-shot exposure, and as to all of the other layers to be patterned after the one-shot exposure, the patterning is performed by division exposure.

3. A method for manufacturing a semiconductor apparatus device, said method including the steps of dividing a pattern of at least one layer into a plurality of sub-patterns, and joining the divided sub-patterns to perform patterning, said method comprising the steps of:
   forming source and drain regions of a MOS transistor on a semiconductor substrate;
   forming a gate insulating film and a gate electrode of the MOS transistor;
   forming a wiring layer including gate wiring connected to the gate electrode;
   forming the gate wiring by performing patterning by means of a one-shot exposure to the wiring layer;
   forming an insulating film after forming the gate wiring; and
   forming a contact hole in the insulating film by using the steps of dividing a pattern of at least one layer into a plurality of sub-patterns, and joining the divided sub-patterns to perform patterning.

4. The method according to claim 3, said method further comprising the step of forming a photoelectric conversion portion.

* * * * *

UNITED STATES PATENT AND TRADEMARK OFFICE
CERTIFICATE OF CORRECTION

PATENT NO. : 7,052,986 B2
APPLICATION NO. : 10/664858
DATED : May 30, 2006
INVENTOR(S) : Yasuo Yamazaki It is certified that error appears in the above-identified patent and that said Letters Patent is hereby corrected as shown below:

IN THE DRAWINGS:
"Sheet 5 of 7," in "FIG. 5," at the bottom of the drawing, between the elements represented by reference numerals "21" and "22," " $\overset{a}{\leftrightarrow}$ " should read -- $\overset{b}{\leftrightarrow}$ --

COLUMN 2:
Line 66, "(hereupon," should read -- (hereinafter, --.

COLUMN 3:
Line 60, "influence" should read -- influenced --.

COLUMN 4:
Line 57, "plane" should read -- plan --.

COLUMN 5:
Line 18, "methal" should read -- metal --.
Line 24, "stage" should read -- state --.

COLUMN 6:
Line 13, "contract" should read -- contact --.
Line 28, "both the" should read -- both --.
Line 59, "line W-W'," should read -- line W-W'.--.
Line 60, "this" should read -- This --.

COLUMN 7:
Line 62, "are" should read -- area --.

UNITED STATES PATENT AND TRADEMARK OFFICE
CERTIFICATE OF CORRECTION

PATENT NO. : 7,052,986 B2
APPLICATION NO. : 10/664858
DATED : May 30, 2006
INVENTOR(S) : Yasuo Yamazaki It is certified that error appears in the above-identified patent and that said Letters Patent is hereby corrected as shown below:

COLUMN 8:
Line 51, "above mentioned" should read -- above-mentioned --.

Signed and Sealed this

Twenty-sixth Day of December, 2006

JON W. DUDAS
*Director of the United States Patent and Trademark Office*